(12) United States Patent
Kim et al.

(10) Patent No.: US 12,164,331 B2
(45) Date of Patent: Dec. 10, 2024

(54) ELECTRONIC DEVICE

(71) Applicant: Samsung Display Co., Ltd., Yongin-Si (KR)

(72) Inventors: Min-Sung Kim, Hwaseong-si (KR); Sena Ryu, Suwon-si (KR); Juhee Song, Seoul (KR); Joonggun Chong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/370,288

(22) Filed: Jul. 8, 2021

(65) Prior Publication Data

US 2022/0155821 A1 May 19, 2022

(30) Foreign Application Priority Data

Nov. 18, 2020 (KR) .......................... 10-2020-0154513

(51) Int. Cl.
*G06F 1/16* (2006.01)
*B32B 7/12* (2006.01)
(Continued)

(52) U.S. Cl.
CPC .............. *G06F 1/1641* (2013.01); *B32B 7/12* (2013.01); *G06F 1/1652* (2013.01); *G09G 3/03* (2020.08); *G09G 3/3208* (2013.01); *H01L 27/156* (2013.01); *H05K 5/0018* (2022.08); *H10K 59/10* (2023.02); *H10K 59/38* (2023.02);
(Continued)

(58) Field of Classification Search
CPC ................. G06F 1/1641; G06F 1/1652; G06F 2203/04102; G06F 1/1626; G06F 1/1643; G06F 1/1656; G06F 1/16; G06F 2200/1635; B32B 7/12; B32B 2307/546; B32B 27/34; B32B 27/286; B32B 27/281; B32B 27/30; B32B 2307/7376; B32B 2457/20; B32B 2307/51; B32B 3/266; G02F 1/133308; G02F 1/133305; G02F 2201/50; G02F 1/133331; G02F 1/133345; H10K 2102/311; H10K 77/111; H05K 5/03; H05K 1/0281; H05K 2201/0154; H05K 2201/0104; H05K 2201/10128; G09G 2380/02
See application file for complete search history.

(56) References Cited

U.S. PATENT DOCUMENTS 9,723,714 B2 8/2017 Huitema
9,857,957 B2 1/2018 Lee et al.
(Continued)

FOREIGN PATENT DOCUMENTS

JP 202060689 A 4/2020
KR 1020150085352 A 7/2015
(Continued)

*Primary Examiner* — Dismery Mercedes
(74) *Attorney, Agent, or Firm* — CANTOR COLBURN LLP

(57) ABSTRACT

An electronic device includes a window, a display panel disposed below the window, and a cushion member disposed below the display panel, wherein the cushion member includes a barrier film having a modulus in a range of about 1 GPa to about 15 GPa and a cushion layer disposed below the barrier film and having a modulus of about 1 MPa or less.

16 Claims, 9 Drawing Sheets

(51) Int. Cl.

| | | |
|---|---|---|
| *G09G 3/00* | (2006.01) | |
| *G09G 3/3208* | (2016.01) | |
| *H01L 27/15* | (2006.01) | |
| *H05K 5/00* | (2006.01) | |
| *H10K 59/10* | (2023.01) | |
| *H10K 59/38* | (2023.01) | |
| *H10K 77/10* | (2023.01) | |
| *B32B 27/28* | (2006.01) | |

(52) U.S. Cl.
CPC .......... *H10K 77/111* (2023.02); *B32B 27/281* (2013.01); *B32B 2457/20* (2013.01); *G09G 2300/0404* (2013.01)

(56) References Cited

U.S. PATENT DOCUMENTS

| | | | |
|---|---|---|---|
| 10,476,013 B2 | 11/2019 | Shin et al. | |
| 10,936,012 B2 | 3/2021 | Kim | |
| 11,092,845 B2* | 8/2021 | Ueki | G02F 1/13338 |
| 11,262,482 B2* | 3/2022 | Chuang | B32B 15/18 |
| 11,271,066 B2* | 3/2022 | Hu | H10K 59/122 |
| 2014/0234599 A1 | 8/2014 | Chung et al. | |
| 2016/0118620 A1* | 4/2016 | Yoo | H10K 85/40 |
| | | | 257/40 |
| 2017/0241039 A1* | 8/2017 | Takai | C25D 5/48 |
| 2017/0263891 A1* | 9/2017 | Oh | H10K 77/111 |
| 2018/0061893 A1* | 3/2018 | Breedlove | H10K 59/38 |
| 2018/0186935 A1* | 7/2018 | Komatsu | B32B 27/34 |
| 2018/0352664 A1* | 12/2018 | Park | B32B 7/022 |
| 2019/0049630 A1* | 2/2019 | Chuang | B32B 27/365 |
| 2019/0073505 A1* | 3/2019 | Kwon | H05K 1/028 |
| 2019/0101784 A1* | 4/2019 | Shin | H04M 1/0268 |
| 2020/0134278 A1* | 4/2020 | Lee | G06F 1/1626 |
| 2020/0260596 A1* | 8/2020 | Park | B32B 7/12 |
| 2020/0407506 A1* | 12/2020 | Kim | C08K 3/105 |
| 2021/0147717 A1* | 5/2021 | Song | B32B 7/12 |
| 2021/0202879 A1* | 7/2021 | Park | H10K 50/841 |
| 2021/0407344 A1* | 12/2021 | Lee | H10K 59/1213 |
| 2022/0199923 A1* | 6/2022 | Yamane | B32B 15/09 |
| 2022/0393121 A1* | 12/2022 | Gu | H10K 77/111 |

FOREIGN PATENT DOCUMENTS

| | | |
|---|---|---|
| KR | 1020190098888 A | 8/2019 |
| KR | 1020190105692 A | 9/2019 |
| KR | 102037377 B1 | 10/2019 |
| KR | 1020200052643 A | 5/2020 |

* cited by examiner

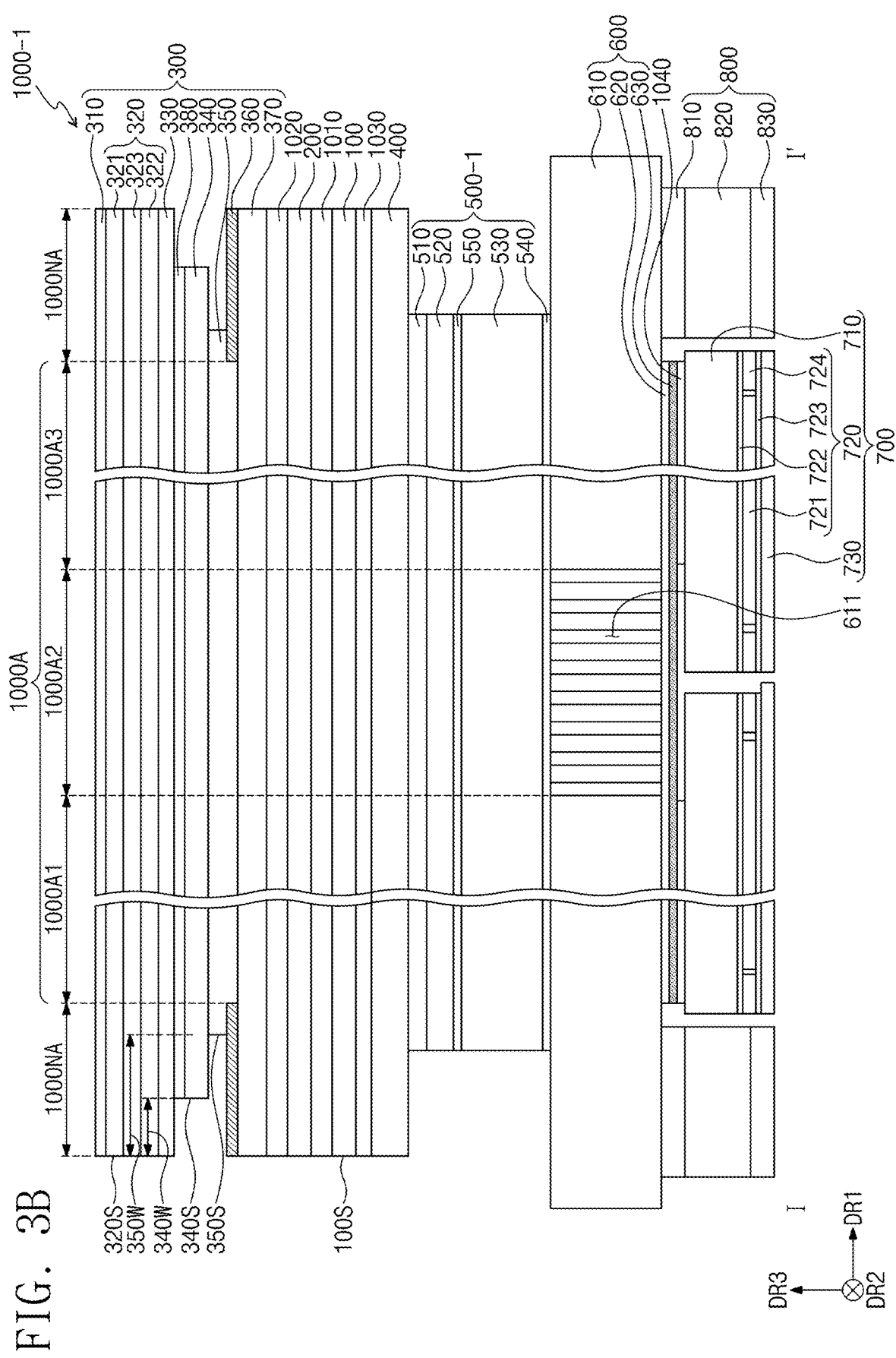

ELECTRONIC DEVICE

This application claims priority to Korean Patent Application No. 10-2020-0154513, filed on Nov. 18, 2020, and all the benefits accruing therefrom under 35 U.S.C. § 119, the content of which in its entirety is herein incorporated by reference.

BACKGROUND

1. Field

The disclosure herein relates to an electronic device, and more particularly, to a foldable electronic device.

2. Description of the Related Art

Electronic devices typically include active areas activated according to electrical signals. Such electronic devices may detect inputs applied from an outside through the active areas while displaying various images to provide information to users. In recent years, various forms of electronic devices are developed, and accordingly, active areas having various forms are being implemented.

SUMMARY

The disclosure provides an electronic device with improved impact resistance and improved visibility.

An embodiment of the invention provides an electronic device including a window, a display panel disposed below the window, and a cushion member disposed below the display panel, wherein the cushion member includes a barrier film having a modulus in a range of about 1 gigapascal (GPa) to about 15 GPa and a cushion layer disposed below the barrier film and having a modulus of about 1 MPa or less.

In an embodiment, the barrier film may include at least one selected from polyimide, polyamide, polyetheretherketone, and polyethylene terephthalate.

In an embodiment, the cushion layer may include a foam.

In an embodiment, the cushion layer may have an average density in a range of about 0.1 gram per cubic centimeter (g/cm$^3$) to about 0.9 g/cm$^3$.

In an embodiment, at least one folding area may be defined in the display panel.

In an embodiment, a first non-folding area, a first folding area, a second non-folding area, a second folding area, and a third non-folding area may be defined in the display panel along one direction.

In an embodiment, the barrier film may have a thickness in a range of about 8 μm to about 40 μm; and the cushion layer may have a thickness in a range of about 60 μm to about 120 μm.

In an embodiment, the barrier film may have a break elongation in a range of about 20% to about 200%.

In an embodiment, the electronic device may further include a lower protective member disposed between the display panel and the cushion member.

In an embodiment, the cushion layer may be directly disposed on a lower surface of the barrier film.

In an embodiment, the cushion member may further include an intermediate cushion adhesive layer disposed between the barrier film and the cushion layer.

In an embodiment, the electronic device may further include a lower support member disposed below the cushion member.

In an embodiment, the electronic device may further include an anti-reflection member disposed between the display panel and the window.

In an embodiment, the display panel may include a base layer, a circuit layer disposed on the base layer, a light emitting element layer disposed on the circuit layer, an encapsulation layer disposed on the light emitting element layer, and a sensor layer disposed on the encapsulation layer.

In an embodiment of the invention, an electronic device includes a window, a display panel disposed below the window, and a cushion member disposed below the display panel, wherein the cushion member includes a barrier film having a modulus in a range of about 1 GPa to about 15 GPa and having a break elongation in a range of about 20% to about 200%, and a cushion layer disposed below the barrier film.

In an embodiment, the display panel may be folded and unfolded along a folding axis extending along one direction.

In an embodiment of the invention, an electronic device includes a window, an anti-reflection member disposed below the window, a display panel disposed below the anti-reflection member, a lower protective member disposed below the display panel, and a cushion member disposed below the lower protective member, wherein the cushion member includes a barrier film having a modulus in a range of about 1 GPa to about 15 GPa, and a cushion layer disposed below the barrier film and having a foam, and the window, the anti-reflection member, the display panel, the lower protective member, and the cushion member are folded and unfolded along a folding axis extending along one direction.

BRIEF DESCRIPTION OF THE DRAWINGS

The above and other features of the invention will become more apparent by describing in further detail embodiments thereof with reference to the accompanying drawings, in which:

FIGS. 3A and 3B are cross-sectional views of an electronic device according to an embodiment of the invention;

DETAILED DESCRIPTION

Figure 1A:
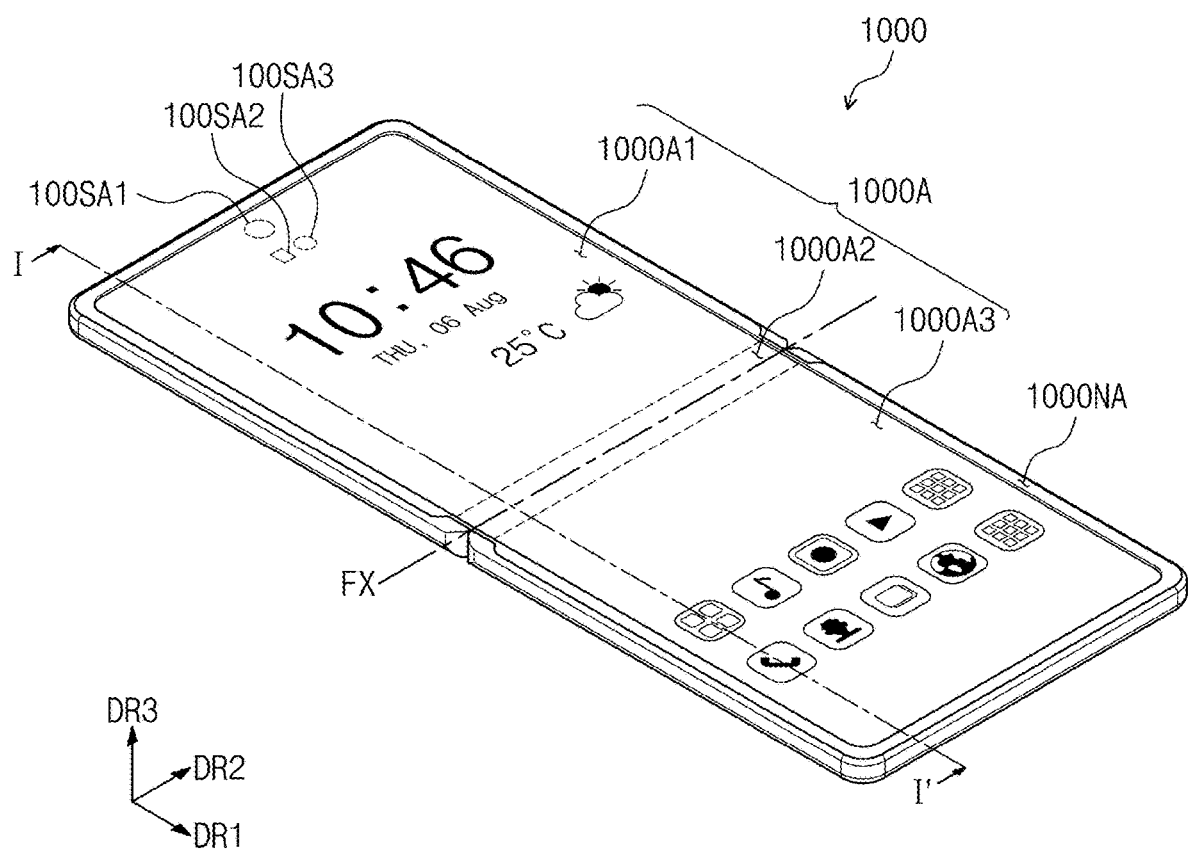
FIG. 1A is a perspective view of an electronic device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the description, when an element (or a region, a layer, a portion, etc.) is referred to as being "on," "connected to," or "coupled to" another element, it means that the element may be directly connected to/coupled to the other element, or that a third element may be disposed therebetween.

Like reference numerals refer to like elements. Also, in the drawings, the thickness, the ratio, and the dimensions of elements are exaggerated for an effective description of technical contents. The term "and/or," includes all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the invention. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the description, "directly disposed" may indicate that there is no layer, film, region, plate or the like added between a portion of a layer, a film, a region, a plate or the like and other portions. For example, "directly disposed" may indicate disposing without additional members such as an adhesive member between two layers or two members.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which the invention pertains. It is also to be understood that terms defined in commonly used dictionaries should be interpreted as having meanings consistent with the meanings in the context of the related art, and are expressly defined herein unless they are interpreted in an ideal or overly formal sense.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

Figure 1B:
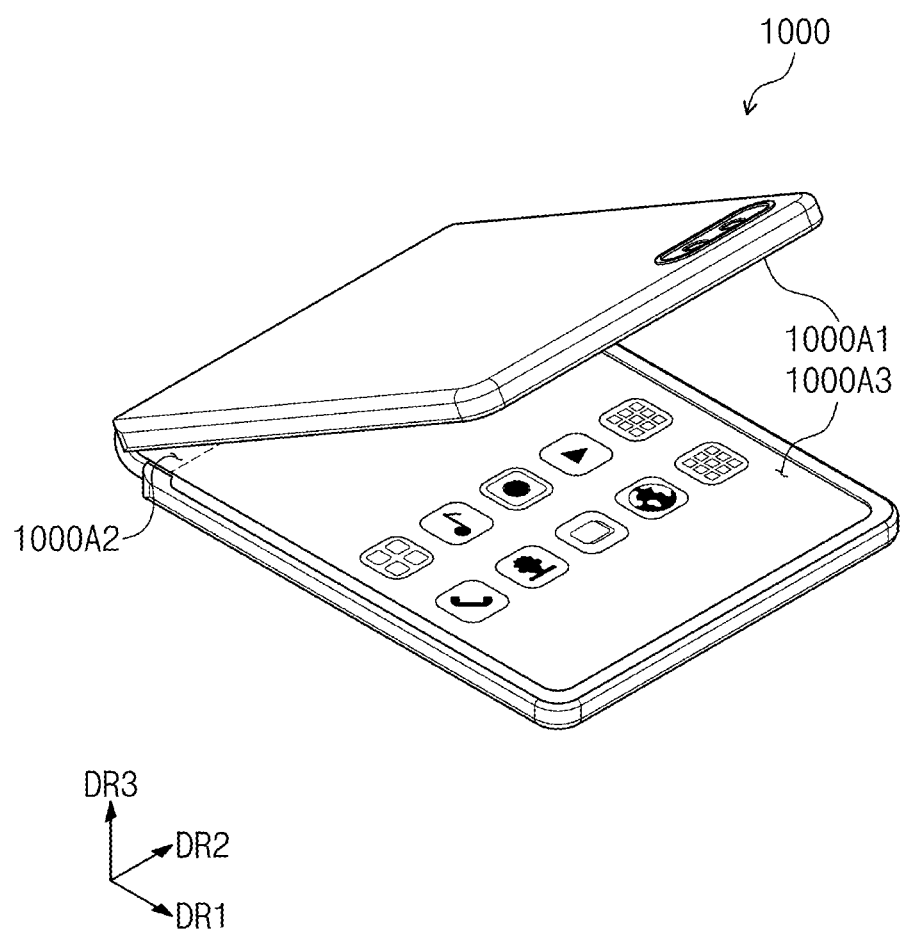
FIG. 1B is a perspective view of an electronic device in a folding operation according to an embodiment of the invention.

FIG. 1A is a perspective view illustrating an electronic device 1000 in an unfolded state according to an embodiment of the invention, and FIG. 1B is a view of an electronic device 1000 in a folding operation according to an embodiment of the invention.

Referring to FIGS. 1A and 1B, an embodiment of the electronic device 1000 may be a device activated according to electrical signals. In one embodiment, for example, the electronic device 1000 may be a mobile phone, a tablet, a car navigation system, a game console, or a wearable device, but is not limited thereto. In FIG. 1A, an embodiment where the electronic device 1000 is a mobile phone is illustrated, for convenience of illustration and description.

The electronic device 1000 may display images through an active area 1000A. When the electronic device 1000 is unfolded, the active area 1000A may include a plane defined by a first direction DR1 and a second direction DR2. A thickness direction of the electronic device 1000 may be parallel to a third direction DR3 crossing the first direction DR1 and the second direction DR2. Therefore, a front surface (or an upper surface) and a rear surface (or a lower surface) of members constituting the electronic device 1000 may be defined with respect to the third direction DR3.

The active area 1000A may include a first area 1000A21, a second area 1000A2, and a third area 1000A3. The second area 1000A2 may be bent along a folding axis FX extending along the second direction DR2. Accordingly, the first area 1000A1 and the third area 1000A3 may be referred to as non-folding areas, and the second area 1000A2 may be referred to as a folding area.

When the electronic device 1000 is folded, the first area 1000A1 and the third area 1000A3 may face each other. Accordingly, in a fully folded state, the active area 1000A may not be exposed to an outside, which may be referred to as in-folding. However, this is merely an example, and the operation of the electronic device 1000 is not limited thereto.

In one embodiment, for example, when the electronic device 1000 is folded, the first area 1000A1 and the third area 1000A3 may not face each other, and be spaced apart from each other with lower components of the electronic device 1000 therebetween. Accordingly, in a folded state, the active area 1000A may be exposed to the outside, which may be referred to as out-folding.

In an embodiment, the electronic device 1000 may be configured to perform only any one of in-folding or out-folding. Alternatively, the electronic device 1000 may be configured to perform both in-folding and out-folding. In such an embodiment, the same area of the electronic device 1000, for example, the second area 1000A2 may be in-folded and out-folded. Alternatively, some areas of the electronic device 1000 may be in-folded, and some other areas may be out-folded.

FIGS. 1A and 1B shows an embodiment including one folding area and two non-folding areas, but the number of folding areas and non-folding areas is not limited thereto. In one embodiment, for example, the electronic device 1000 may include a plurality of non-folding areas which are more than two, and a plurality of folding areas disposed between non-folding areas which are adjacent to each other.

FIGS. 1A and 1B illustrate an embodiment where the folding axis FX is parallel to a minor axis of the electronic device 1000, but the embodiment of the invention is not limited thereto. In one embodiment, for example, the folding axis FX may extend along a major axis of the electronic device 1000, for example, a direction parallel to the first direction DR1. In such an embodiment, the first area 1000A1, the second area 1000A2, and the third area 1000A3 may be sequentially arranged along the second direction DR2.

A plurality of sensing areas 100SA1, 100SA2, and 100SA3 may be defined in the electronic device 1000. In an embodiment, as shown in FIG. 1A, three sensing areas 100SA1, 100SA2, and 100SA3 may be defined in the electronic device 1000, but the number of the plurality of sensing areas 100SA1, 100SA2, and 100SA3 is not limited thereto.

The plurality of sensing areas 100SA1, 100SA2, and 100SA3 may include a first sensing area 100SA1, a second sensing area 100SA2, and a third sensing area 100SA3. In one embodiment, for example, the first sensing area 100SA1 may overlap a camera module, and the second sensing area 100SA2 and the third sensing area 100SA3 may overlap a proximity sensor and an illuminance sensor, but is not limited thereto.

The plurality of electronic modules may each receive external inputs transmitted through the first sensing area 100SA1, the second sensing area 100SA2, or the third sensing area 100SA3, or may provide outputs through the first sensing area 100SA1, the second sensing area 100SA2, or the third sensing area 100SA3.

The first sensing area 100SA1 may be surrounded by the active area 1000A, and the second sensing area 100SA2 and the third sensing area 100SA3 may be included in the active area 1000A. In such an embodiment, the second sensing area 100SA2 and the third sensing area 100SA3 may display images. The first sensing area 100SA1, the second sensing area 100SA2, and the third sensing area 100SA3 may each have a greater transmittance than the remaining areas of the active area 1000A. In such an embodiment, the first sensing area 100SA1 may have a greater transmittance than each of the second sensing area 100SA2 and the third sensing area 100SA3. In an embodiment of the electronic device 1000, some of the plurality of electronic modules may overlap the active area 1000A, and the others may be surrounded by the active area 1000A. Accordingly, areas in which the plurality of electronic modules are to be disposed may not be provided to a peripheral area 1000NA around the active area 1000A, and an area ratio of the active area 1000A with respect to a total area of the electronic device 1000 may increase.

Figure 2A:
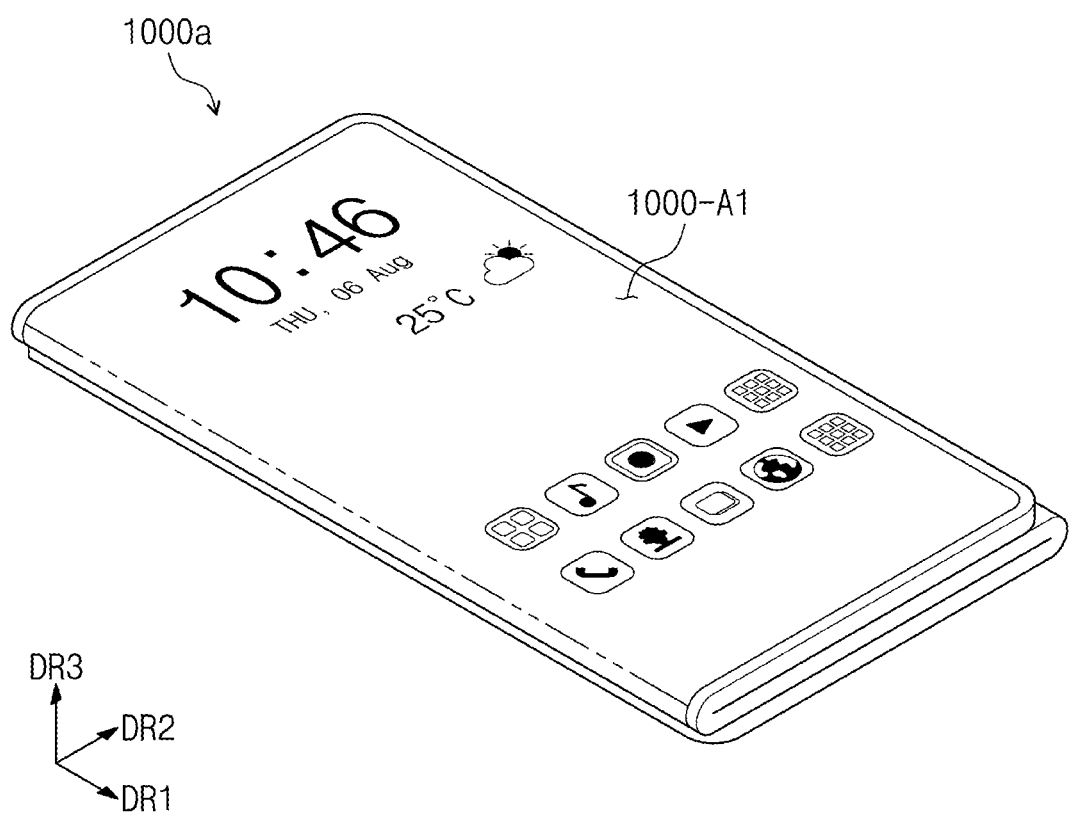
FIG. 2A is a perspective view of an electronic device in a folded state according to an embodiment of the invention.
Figure 2B:
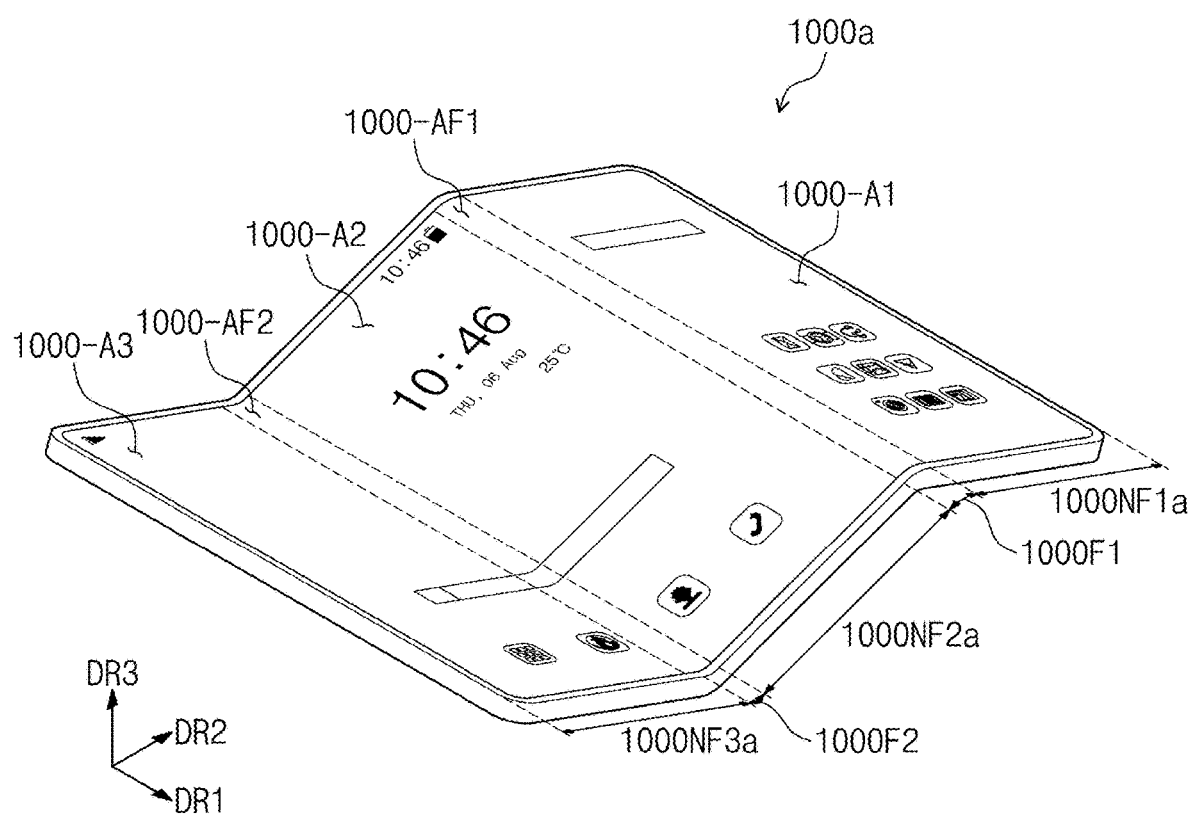
FIG. 2B is a perspective view of an electronic device in a folding operation according to an embodiment of the invention.

FIG. 2A is a perspective view of an electronic device 1000a in a folded state according to an embodiment of the invention. FIG. 2B is a perspective view of an electronic device 1000a in a folding operation according to an embodiment of the invention.

Referring to FIGS. 2A and 2B, an embodiment of the electronic device 1000a may be a multi-foldable electronic device. The electronic device 1000a may have a first non-folding area 1000NF1a, a first folding area 1000F1, a second non-folding area 1000NF2a, a second folding area 1000F2, and a third non-folding area 1000NF3a defined sequentially along the second direction DR2. In such an embodiment, a plurality of folding areas 1000F1 and 1000F2 may be defined in the electronic device 1000a.

The electronic device 1000a may display images through a first active area 1000-A1, a second active area 1000-A2, and a third active area 1000-A3. At least a portion of the first active area 1000-A1 may overlap the first non-folding area 1000NF1a, at least a portion of the second active area 1000-A2 may overlap the second non-folding area 1000NF2a, and at least a portion of the third active area 1000-A3 may overlap the third non-folding area 1000NF3a. In an embodiment, the first active area 1000-A1, the second active area 1000-A2, and the third active area 1000-A3 may be sequentially or continuously arranged with each other. In an embodiment, the electronic device 1000a further includes a fourth active area 1000-AF1 overlapping the first folding area 1000F1 and a fifth active area 1000-AF2 overlapping the second folding area 1000F2 and the first active area 1000-A1. In such an embodiment, the fourth active area 1000-AF1, the second active area 1000-A2, the fifth active area 1000-AF2, and the third active area 1000-A3 may be sequentially arranged in the electronic device 1000a.

However, the embodiment of the invention is not limited thereto, and at least some of the first active area 1000-A1, the second active area 1000-A2, and the third active area 1000-A3 may be non-sequential or non-continuous. In one embodiment, for example, the fourth active area 1000-AF1 may be omitted, and the first active area 1000-A1 and the second active area 1000-A2 may be non-sequential. The first active area 1000-A1 and the second active area 1000-A2 may be spaced apart from each other with the first non-folding area 1000NF1a therebetween. Alternatively, the fifth active area 1000-AF2 may be omitted, and the second active area 1000-A2 and the third active area 1000-A3 may be spaced apart from each other with the second non-folding area 1000NF2a therebetween and may thus be non-sequential.

The first folding area 1000F1 may be out-folded, and the second folding area 1000F2 may be in-folded. However, the embodiment of the invention is not limited thereto, and alternatively, the first folding area 1000F1 and the second folding area 1000F2 may be each independently out-folded or in-folded.

Figure 3A:
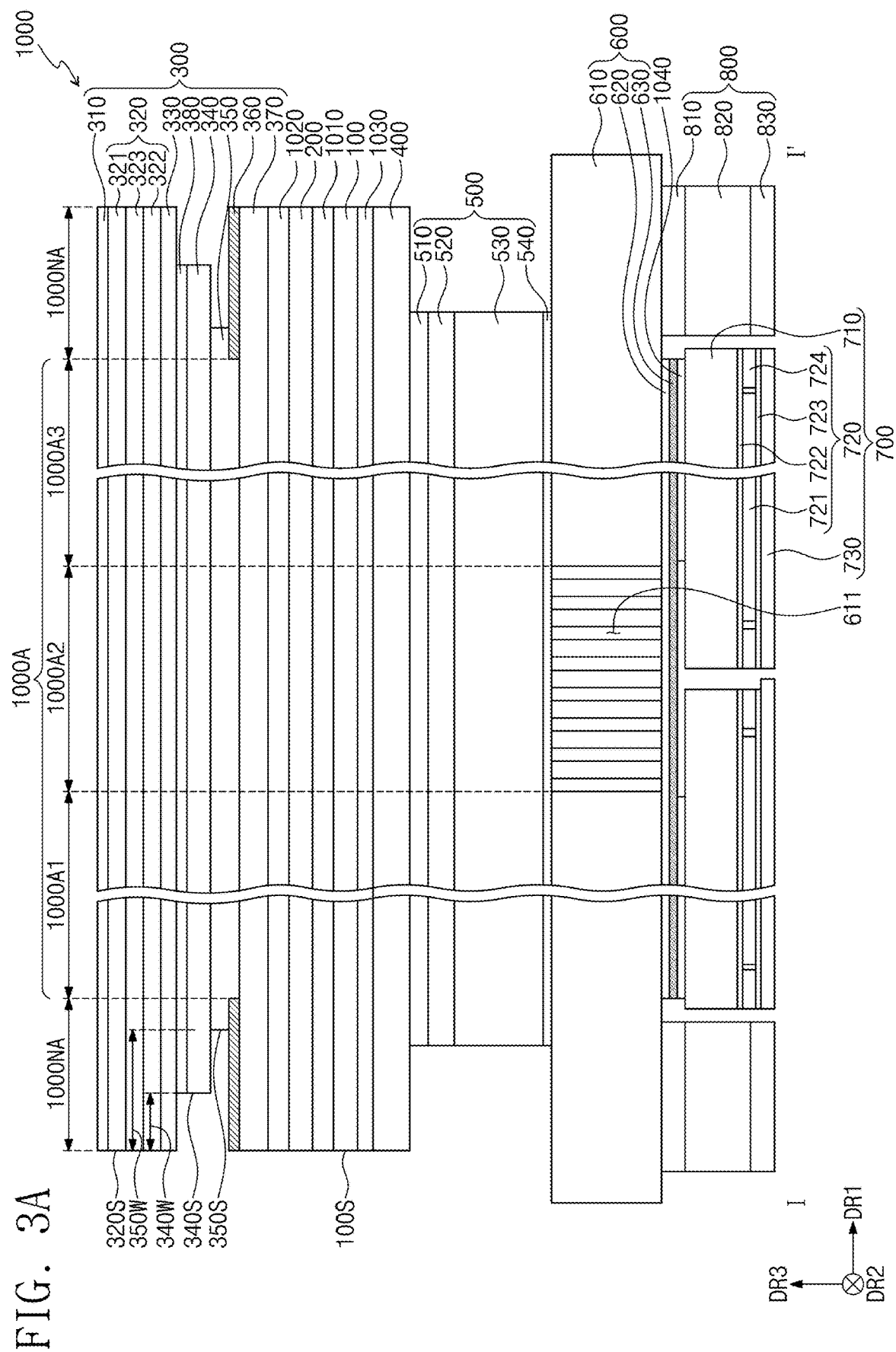
Figure 4:
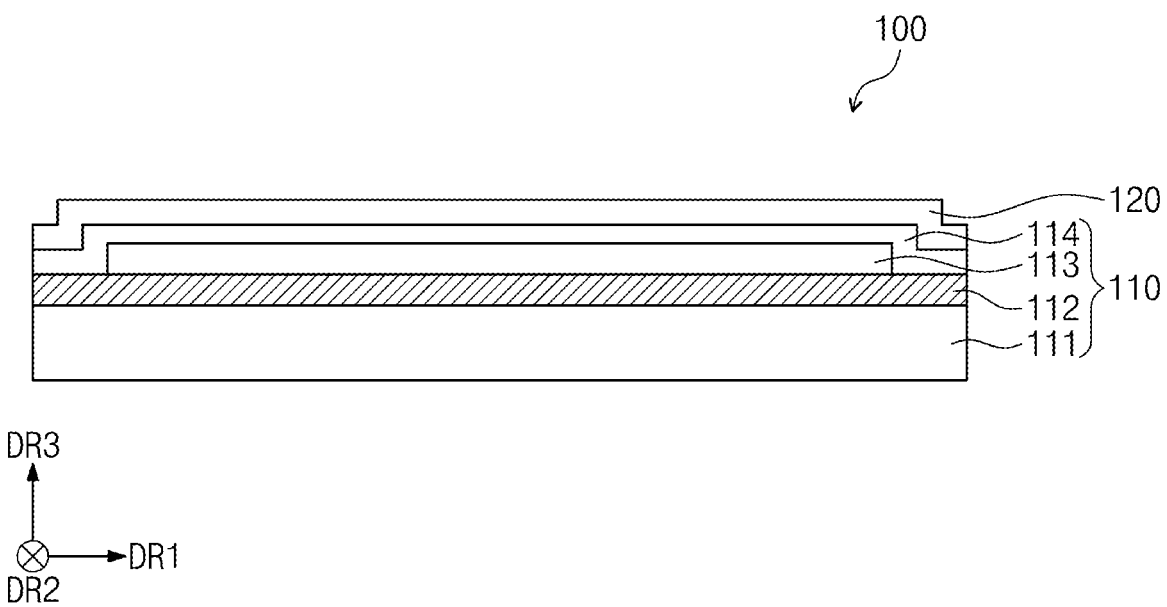
FIG. 4 is a cross-sectional view of a display panel according to an embodiment of the invention.

FIGS. 3A and 3B are cross-sectional views of an electronic device according to an embodiment of the invention. FIGS. 3A and 3B illustrate cross-sectional views of an electronic device taken along line I-I' of FIG. 1A. FIG. 4 is a cross-sectional view of a display panel according to an embodiment of the invention. FIGS. 3A, 3B, and 4 illustrate an embodiment of the electronic device 1000 shown in FIG. 1A for convenience of illustration and description, but the embodiment of the invention is not limited thereto, and similar descriptions may be applied to an embodiment of the electronic device 1000a shown in FIGS. 2A and 2B.

Referring to FIGS. 3A and 3B, an embodiment of the electronic device 1000 may include a display panel 100, upper functional layers, and lower functional layers.

Referring to FIG. 4 first, the display panel 100 may be configured to generate images and detect external inputs applied from an outside. In one embodiment, for example, the display panel 100 may include a display layer 110 and a sensor layer 120. The display panel 100 may have a thickness in a range of about 25 micrometers ($\mu$m) to about 45 $\mu$m, and for example, may have a thickness of about 35 $\mu$m, but the thickness of the display panel 100 is not limited thereto.

The display layer 110 may be configured to substantially generate images. The display layer 110 may be a light emitting display layer, and for example, the display layer 110 may be an organic light emitting display layer, a quantum dot display layer, or a micro light emitting diode ("LED") display layer. The display panel 100 may be an organic light emitting display panel, a quantum dot display panel, or a micro LED display panel according to the configuration of the display layer 110.

The display layer 110 may include a base layer 111, a circuit layer 112, a light emitting element layer 113, and an encapsulation layer 114.

The base layer 111 may include a synthetic resin layer. The synthetic resin layer may include a thermosetting resin. The synthetic resin layer may be a polyimide-based resin layer and the material is not particularly limited, and the synthetic resin layer may include at least one selected from an acrylic-based resin, a methacrylate-based resin, polyisoprene, a vinyl-based resin, an epoxy-based resin, a urethane-based resin, a cellulose-based resin, a siloxane-based resin, a polyamide-based resin, and a perylene-based resin. In an embodiment, the base layer 111 may include a glass substrate or an organic/inorganic composite material substrate.

The base layer 111 may have a multilayer structure. In one embodiment, for example, the base layer 111 may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

The first and second synthetic resin layers may each include a same material as the synthetic resin layer described above. Herein, a "specific function-based resin" refers to a resin including a "specific functional group".

The base layer 111 may have a thickness in a range of about 10 $\mu$m to about 30 $\mu$m. In one embodiment, for example, the base layer 111 may have a thickness of about 20 $\mu$m.

The circuit layer 112 may be disposed on the base layer 111. The circuit layer 112 may include an insulating layer, a semiconductor pattern, a conductive pattern, and a signal line. An insulating layer, a semiconductor layer, and a conductive layer are formed on the base layer 111 through methods such as coating or vapor deposition, and then the insulating layer, the semiconductor layer, and the conductive layer may be selectively patterned by a repeated photolithography process. Thereafter, a semiconductor pattern, a conductive pattern, and a signal line included in the circuit layer 112 may be formed.

The light emitting element layer 113 may be disposed on the circuit layer 112. The light emitting element layer 113 may include a light emitting element. In one embodiment, for example, the light emitting element layer 113 may include organic light emitting materials, quantum dots, quantum rods, or micro LEDs.

A total thickness of the circuit layer 112 and the light emitting element layer 113 may be in a range of about 1 $\mu$m to about 5 $\mu$m. In one embodiment, for example, a total thickness of the circuit layer 112 and the light emitting element layer 113 may be about 3 $\mu$m.

The encapsulation layer 114 may be disposed on the light emitting element layer 113. The encapsulation layer 114 may include an inorganic layer, an organic layer, and an inorganic layer which are sequentially stacked one on another, but the layers forming the encapsulation layer 114 are not limited thereto.

The inorganic layers may protect the light emitting element layer 113 from moisture and oxygen, and the organic layer may protect the light emitting element layer 113 from foreign substances such as dust particles. The inorganic layers may include a silicon nitride layer, a silicon oxy nitride layer, a silicon oxide layer, a titanium oxide layer, or an aluminum oxide layer. The organic layer may include an acrylic-based organic layer, but is not limited thereto.

The encapsulation layer 114 may have a thickness in a range of about 3 $\mu$m to about 10 $\mu$m. In one embodiment, for example, the encapsulation layer 114 may have a thickness of about 6 $\mu$m.

The sensor layer 120 may be disposed on the display layer 110. The sensor layer 120 may detect external inputs applied from the outside. The external inputs may be a user's inputs. The user's inputs may include various types of external inputs such as a part of a user's body, light, heat, pen, or pressure.

In an embodiment, the sensor layer 120 may be provided or formed on the display layer 110 through a continuous process. In such an embodiment, the sensor layer 120 may be directly disposed on the display layer 110. In such an embodiment, a third component may not be disposed between the sensor layer 120 and the display layer 110, and the sensor layer 120 and the display layer 110 may contact each other. In such an embodiment, a separate adhesive member may not be disposed between the sensor layer 120 and the display layer 110. When the sensor layer 120 is directly disposed on the display layer 110, the sensor layer 120 may have a thickness of, for example, about 2 $\mu$m.

Alternatively, the sensor layer 120 may be separately prepared and bonded to the display layer 110 through an adhesive member. The adhesive layer may include a conventional adhesive or a gluing agent.

Referring back to FIG. 3A, the upper functional layers may be disposed on the display panel 100. In one embodiment, for example, the upper functional layers may include an anti-reflection member 200 and an upper member 300.

The anti-reflection member 200 may be referred to as an anti-reflection layer. The anti-reflection member 200 may reduce reflectance of external light incident from the outside. The anti-reflection member 200 may include a stretched synthetic resin film. In one embodiment, for example, the anti-reflection member 200 may be provided by dyeing an iodine compound onto a polyvinyl alcohol ("PVA") film. However, this is merely an example, and the material forming the anti-reflection member 200 is not limited to those described above. The anti-reflection member 200 may have a thickness in a range of about 3 $\mu$m to about 35 $\mu$m, and the thickness of the anti-reflection member 200 is not limited thereto.

In an embodiment, the anti-reflection member 200 may include color filters. The color filters may have a predetermined arrangement. In the anti-reflection member 200, the arrangement of color filters may be determined in consideration of emission colors of pixels included in the display layer 110. In an embodiment, the anti-reflection layer may further include a black matrix adjacent to the color filters.

In an embodiment, the anti-reflection member 200 may include a destructive interference structure. In one embodiment, for example, the destructive interference structure may include a first reflection layer and a second reflection layer disposed on different layers. First reflection light and second reflection light, which are respectively reflected from the first reflection layer and the second reflection layer, may destructively interfere with each other, thereby reducing reflectance of the external light.

The anti-reflection member 200 may be bonded to the display panel 100 through a first adhesive layer 1010. The first adhesive layer 1010 may be a transparent adhesive layer such as a pressure sensitive adhesive ("PSA") film, an optically clear adhesive ("OCA") film, or an optically clear adhesive resin ("OCR"). The adhesive layer that will be described later may include a conventional adhesive or a gluing agent. The first adhesive layer 1010 may have a thickness in a range of about 20 µm to about 30 µm, and for example, may have a thickness of about 25 µm, but the thickness of the first adhesive layer 1010 is not limited thereto.

In an embodiment of the invention, the first adhesive layer 1010 may be omitted, and in such an embodiment, the anti-reflection member 200 may be directly disposed on the display panel 100. In such an embodiment, a separate adhesive layer may not be disposed between the anti-reflection member 200 and the display panel 100. In such an embodiment where the anti-reflection member 200 is directly disposed on the display panel 100, the anti-reflection member 200 may have a thickness of, for example, about 4.8 µm.

The upper member 300 may be disposed on the anti-reflection member 200. The upper member 300 may include a first hard coating layer 310, a protective layer 320, a first upper adhesive layer 330, a window 340, a second upper adhesive layer 350, a black matrix 360, a shock absorbing layer 370, and a second hard coating layer 380. Components included in the upper member 300 are not limited to the components described above. At least some of the components described above may be omitted, and other components may be added.

The first hard coating layer 310 may be a layer disposed in or define an outermost surface of the electronic device 1000. The first hard coating layer 310 may be a functional layer for improving use characteristics of the electronic device 1000, and may be provided by being coated on the protective layer 320. In one embodiment, for example, through the first hard coating layer 310, anti-fingerprint, anti-pollution, and scratch-resistant characteristics may be enhanced. The first hard coating layer 310 may have a thickness in a range of about 1 µm to about 5 µm, and may have a thickness of, for example, about 3 µm.

The protective layer 320 may be disposed below the first hard coating layer 310. The protective layer 320 may protect components disposed therebelow. The protective layer 320 may be additionally provided with the first hard coating layer 310 and an anti-fingerprint layer to improve properties such as chemical resistance and abrasion resistance. The protective layer 320 may include a film having a modulus of about 15 gigapascals (GPa) or less at a room temperature. The protective layer 320 may have a thickness in a range of about 30 µm to about 200 µm, but the thickness of the protective layer 320 is not limited thereto. In an embodiment, the protective layer 320 may be omitted. The protective layer 320 may have a multilayer structure. In one embodiment, for example, the protective layer 320 may include a plurality of synthetic resin films 321 and 322 bonded to each other through an adhesive. The protective layer 320 may include a first protective layer 321, a second protective layer 322, and a protective adhesive layer 323 bonding the protective layers 321 and 322. In the protective layer 320, the first protective layer 321 and the second protective layer 322 may each have a thickness in a range of about 30 µm to about 120 µm. In one embodiment, for example, the first protective layer 321 may have a thickness of about 100 µm, and the second protective layer 322 may have a thickness of about 40 µm.

The first upper adhesive layer 330 may be disposed below the protective layer 320. The protective layer 320 and the window 340 may be bonded to each other through the first upper adhesive layer 330. The first upper adhesive layer 330 may have a thickness in a range of about 20 µm to about 60 µm, and for example, may have a thickness of about 50 µm, but the thickness of the first upper adhesive layer 330 is not limited thereto.

The window 340 may be disposed below the first upper adhesive layer 330. The window 340 may include an optically transparent insulating material. In one embodiment, for example, the window 340 may include a glass substrate or a synthetic resin film. In an embodiment where the window 340 is a glass substrate, the window 340 may have a thickness of about 80 µm or less, and, for example, may have a thickness of about 40 µm, but the thickness of the window 340 is not limited thereto.

In an embodiment where the window 340 is a synthetic resin film, the window 340 may include a polyimide ("PI") film or a PET film.

The window 340 may have a multilayer structure or a single layer structure. In one embodiment, for example, the window 340 may include a plurality of synthetic resin films bonded to each other through an adhesive, or a glass substrate and a synthetic resin film, which are bonded to each other through an adhesive.

A second hard coating layer 380 may be disposed on an upper surface of the window 340. The second hard coating layer 380 may be a functional layer for improving use characteristics of the electronic device 1000. In one embodiment, for example, through the second hard coating layer 380, anti-pollution, scratch-resistance, and impact-resistance characteristics may be enhanced. The second hard coating layer 380 may have a thickness in a range of about 1 µm to about 5 µm, and may have a thickness of, for example, about 1.5 µm.

The second upper adhesive layer 350 may be disposed below the window 340. The window 340 and the shock absorbing layer 370 may be bonded to each other through the second upper adhesive layer 350. The second upper adhesive layer 350 may have a thickness in a range of about 30 µm to about 40 µm, and for example, may have a thickness of about 35 µm, but the thickness of the second upper adhesive layer 350 is not limited thereto.

In an embodiment of the invention, a sidewall 340S of the window 340 and a sidewall 350S of the second upper adhesive layer 350 may be disposed inwardly from sidewalls of layers thereabove or therebelow, for example, a sidewall 100S of the display panel 100 and a sidewall 320S of the protective layer 320. Herein, being disposed inwardly may indicate being closer to the active area 1000A than other elements or layers.

The folding operation of the electronic device 1000 may change the positional relationship among respective layers. According to an embodiment of the invention, the sidewall 340S of the window 340 is disposed inwardly from the sidewall 100S of the display panel 100 and the sidewall 320S of the protective layer 320, and thus even when the positional relationship among respective layers changes, the sidewall 340S of the window 340 may less protrude further than the sidewall 320S of the protective layer 320 in a folded state. Accordingly, the chances of external impacts being delivered through the sidewall 340S of the window 340 may be reduced. As a result, the chances of the window 340 having cracks may be reduced.

In an embodiment, a first distance 340W between the sidewall 340S of the window 340 and the sidewall 320S of the protective layer 320 may be greater than or equal to a predetermined distance. In such an embodiment, the first distance 340W may indicate a distance in a direction parallel to the first direction DR1. In such an embodiment, the first distance 340W may correspond to a distance between the sidewall 340S and the sidewall 320S when viewed on a plane.

The first distance 340W may be in a range about 180 μm to about 205 μm, and for example, may be about 196 μm, but is not limited thereto. In one embodiment, for example, the first distance 340W may be about 50 μm or greater, or about 300 μm. With an increase in the first distance 340W, the protective layer 320 protrudes further than the window 340, and a portion of the protective layer 320 may be bent and bonded to other components, for example, a case, etc. In such an embodiment, with an increase in an area of the protective layer 320, the chances that foreign substances flowing from an upper portion of the protective layer 320 are introduced into a lower portion of the protective layer 320 may be reduced.

In an embodiment, the window 340 and the second upper adhesive layer 350 may be bonded to the shock absorbing layer 370 through a lamination process. Given lamination process tolerance, areas of the window 340 and the second upper adhesive layer 350 may be smaller than an area of the shock absorbing layer 370. In an embodiment, an area of the second upper adhesive layer 350 may be smaller than an area of the window 340. In one embodiment, for example, a pressure may be applied to the second upper adhesive layer 350 in the process of bonding the window 340. The second upper adhesive layer 350 may extend in a direction parallel to the first and second directions DR1 and DR2 under the pressure. In such an embodiment, the area of the second upper adhesive layer 350 may be smaller than the area of the window 340 to prevent the second upper adhesive layer 350 from protruding further than the window 340.

When the first upper adhesive layer 330 and the second upper adhesive layer 350 are bonded to each other, the window 340 may not be slipped in the folding operation of the electronic device 1000, and thus a buckling phenomenon may be caused in the window 340. According to an embodiment of the invention, the area of the second upper adhesive layer 350 is smaller than the area of the window 340. Accordingly, the first upper adhesive layer 330 may not be bonded to the second upper adhesive layer 350, and the chances of foreign matters sticking to the second upper adhesive layer 350 may thus be reduced.

In an embodiment, a second distance 350W between the sidewall 350S of the second upper adhesive layer 350 and the sidewall 320S of the protective layer 320 may be greater than or equal to a first distance 340W. In such an embodiment, the second distance 350W may indicate a distance in a direction parallel to the first direction DR1. In such an embodiment, the second distance 350W may correspond to a distance between the sidewall 350S and the sidewall 320S when viewed on a plane.

The second distance 350W may be about 392 μm, for example, but is not limited thereto. In one embodiment, for example, the second distance 350W may be selected from a range of about 292 μm to about 492 μm, but is not limited to the ranges. The black matrix 360 may be disposed between the shock absorbing layer 370 and the second upper adhesive layer 350. The black matrix 360 may be provided by being printed on an upper surface of the shock absorbing layer 370. The black matrix 360 may overlap a peripheral area 1000NA. The black matrix 360 is a colored layer and may be formed through a coating method. The black matrix 360 may include a colored organic material or an opaque metal, and the materials forming the black matrix 360 are not limited thereto.

FIG. 3A illustrates that an embodiment where the black matrix 360 is disposed on an upper surface of the shock absorbing layer 370, but the disposition of the black matrix 360 is not limited thereto. In one alternative embodiment, for example, the black matrix 360 may be provided on an upper surface of the protective layer 320, a lower surface of the protective layer 320, an upper surface of the window 340, or a lower surface of the window 340. In an embodiment, the black matrix 360 may be provided as or defined by a plurality of layers, and in such an embodiment, some layers of the black matrix 360 may be provided on the upper surface of the shock absorbing layer 370, and the other layers of the black matrix 360 may be provided on the upper surface of the protective layer 320, the lower surface of the protective layer 320, the upper surface of the window 340, or the lower surface of the window 340.

The shock absorbing layer 370 may be a functional layer for protecting the display panel 100 from external impacts. The shock absorbing layer 370 may be selected from films having a modulus of about 1 GPa or greater at a room temperature. The shock absorbing layer 370 may be a stretched film including an optical function. In one embodiment, for example, the shock absorbing layer 370 may be an optical axis control film. The shock absorbing layer 370 may have a thickness in a range of about 35 μm to about 45 μm, and for example, may have a thickness of about 41 μm, but the thickness of the shock absorbing layer 370 is not limited thereto. In an embodiment of the invention, the shock absorbing layer 370 may be omitted.

In an embodiment where the shock absorbing layer 370 is omitted, the anti-reflection member 200 may be bonded to the window 340 through an adhesive layer. In such an embodiment, the anti-reflection member 200 may contact a lower surface of the second adhesive layer 1020, and the window 340 may contact an upper surface of the second adhesive layer 1020. In an embodiment where the shock absorbing layer 370 is omitted, the black matrix 360 may be disposed on the upper surface of the protective layer 320, the lower surface of the protective layer 320, the upper surface of the window 340, or the lower surface of the window 340.

In an embodiment, a planarization layer (not shown) may be provided on a surface of the shock absorbing layer 370. In an embodiment, the shock absorbing layer 370 may include an uneven surface, and may further include a planarization layer on at least one of the upper surface or the lower surface of the shock absorbing layer 370 to fill the unevenness. Accordingly, haze that may be caused by the uneven surface of the shock absorbing layer 370 may be effectively prevented.

The upper member 300 may be bonded to the anti-reflection member 200 through the second adhesive layer 1020. The second adhesive layer 1020 may include a conventional adhesive or a gluing agent. The second adhesive layer 1020 may have a thickness in a range of about 20 μm to about 60 μm, and for example, may have a thickness of about 50 μm, but the thickness of the second adhesive layer 1020 is not limited thereto.

The lower functional layers may be disposed below the display panel 100. In one embodiment, for example, the lower functional layers may include a lower protective film (or a lower protective member) 400, a cushion member 500, a first lower member 600, a second lower member 700, and a step compensation member 800. Components included in the lower functional layers are not limited to the components described above. At least some of the components described above may be omitted, and other components may be added.

The lower protective film 400 may be bonded to a rear surface of the display panel 100 through a third adhesive layer 1030. The lower protective film 400 may prevent scratches from being caused on the rear surface of the display panel 100 in the manufacturing process of the display panel 100. The lower protective film 400 may be a colored PI film. In one embodiment, for example, the lower protective film 400 may be an opaque yellow film, but is not limited thereto.

The lower protective film 400 may have a thickness in a range of about 20 μm to about 50 μm, and, for example, the lower protective film 400 may have a thickness of about 32 μm. The third adhesive layer 1030 may have a thickness in a range of about 13 μm to about 40 μm, and may have a thickness of, for example, about 25 μm. However, the thickness of the lower protective film 400 and the thickness of the third adhesive layer 1030 are not limited thereto.

The cushion member 500 is disposed below the display panel 100. The cushion member 500 may be disposed below the lower protective film 400. The cushion member 500 may protect the display panel 100 from an impact transmitted from the bottom. The electronic device 1000 may have improved impact resistance through the cushion member 500.

The cushion member 500 includes a barrier film 520 and a cushion layer 530. The cushion member 500 may further include a first cushion adhesive layer 510 and a second cushion adhesive layer 540. The components included in the cushion member 500 are not limited to the components described above, and other components may be added in addition to the components described above.

The first cushion adhesive layer 510 and the second cushion adhesive layer 540 may include a conventional adhesive or a gluing agent. The first cushion adhesive layer 510 may be bonded to the lower protective film 400, and the second cushion adhesive layer 540 may be bonded to the first lower member 600. The first cushion adhesive layer 510 may have a thickness of about 25 μm, and the second cushion adhesive layer 540 may have a thickness of about 8 μm. However, the thicknesses of the first cushion adhesive layer 510 and the second cushion adhesive layer 540 are not limited thereto.

The barrier film 520 may be a synthetic resin film, for example, a PI film, but is not limited thereto. The barrier film 520, for example, may include at least one selected from PI, polyamide ("PA"), polyetheretherketone, and polyethylene terephthalate ("PET").

The barrier film 520 may have a thickness in a range of about 8 μm to about 40 μm. In one embodiment, for example, the barrier film 520 may have a thickness of about 20 μm. If the barrier film 520 has a thickness of less than about 8 μm, the impact resistance of the electronic device 1000 may decrease. If the barrier film 520 has a thickness of greater than about 40 μm, the overall thickness of the electronic device 1000 increases, and when the electronic device 1000 is folded, folding stress may be undesirably increased.

The barrier film 520 has a high modulus. The barrier film 520 may prevent deformation of the display panel 100, thereby improving impact resistance of the display panel 100.

The barrier film 520 has a modulus in a range of about 1 GPa to about 15 GPa at a room temperature. In one embodiment, for example, the barrier film 520 may have a modulus in a range of about 5 GPa to about 10 GPa at a room temperature. If the barrier film 520 has a modulus of less than 1 GPa at a room temperature, the lower surface of the barrier film 520 may have a greater tensile strain when the electronic device 1000 is folded, and thus, chances of cracks being caused during the folding operation increase. If the barrier film 520 has a modulus of greater than 15 GPa at a room temperature, the upper surface of the display panel 100 may have a greater compressive strain when the electronic device 1000 is folded, and buckling, etc. may thus be caused.

The barrier film 520 may have a break elongation in a range of about 20% to about 200%. The break elongation refers to a ratio of a stretched length at the time of being broken to an initial length when an object is stretched until broken. If the barrier film 520 has a break elongation of less than 20%, defects such as cracks may be caused in the barrier film 520 when the electronic device 1000 is folded. If the barrier film 520 has a break elongation of greater than 200%, the barrier film 520 has lower adhesion stability and a lower modulus to cause a decrease in reliability of the electronic device 1000.

The cushion layer 530 may include a foam. The cushion layer 530 may have elasticity and have a porous structure. The cushion layer 530 includes a foam, and a plurality of pores may thus be defined in the cushion layer 530, and the cushion layer 530 may easily absorb external shocks.

In an embodiment, the cushion layer 530 may include a polyurethane foam or a thermoplastic polyurethane foam. Alternatively, the cushion layer 530 may include an acrylonitrile butadiene styrene copolymer ("ABS") foam, a polyethylene ("PE") foam, an ethylene vinyl acetate ("EVA") foam, a polyvinyl chloride ("PVC") foam, etc.

The cushion layer 530 may be formed using the barrier film 520 as a base layer. In one embodiment, for example, a mixture including a polyurethane resin and a foaming agent is applied onto the barrier film 520, and then the foaming agent may be foamed to form the cushion layer 530. The cushion layer 530 may be directly disposed on the lower surface of the barrier film 520. The cushion layer 530 may contact the lower surface of the barrier film 520.

In an embodiment, the cushion layer 530 has a lower modulus than the barrier film 520. The cushion layer 530 may have a modulus of about 1 MPa or less. In an embodiment, the cushion layer 530 may have a low density. The cushion layer 530 may have an average density in a range of about 0.1 gram per cubic centimeter (g/cm$^3$) to about 0.9 g/cm$^3$. In one embodiment, for example, the cushion layer 530 may have an average density value of about 0.5 g/cm$^3$. The cushion layer 530 is formed through a foam, and may thus have a modulus and an average density that satisfy the ranges described herein, and accordingly, the cushion layer 530 may easily absorb external shocks, and have improved surface quality to prevent the cushion layer 530 from being viewed from the outside.

The cushion layer 530 may have a thickness in a range of about 60 μm to about 120 μm. In one embodiment, for example, the cushion layer 530 may have a thickness in a range of about 80 μm to about 100 μm. If the cushion layer 530 has a thickness of about less than 60 μm, the cushion layer 530 may have lower external shock absorption, and the impact resistance of the electronic device 1000 may thus deteriorate. If the cushion layer 530 has a thickness of about greater than 120 μm, the overall thickness of the electronic device 1000 may increase and the folding properties may thus deteriorate.

At least one selected from the barrier film 520 and the cushion layer 530 may have colors for absorbing light. In one embodiment, for example, at least any one of the barrier film 520 or the cushion layer 530 may be black. At least any one selected from the barrier film 520 and the cushion layer 530 may include a black material. Accordingly, components disposed below the cushion member 500 may be effectively prevented from being viewed from the outside.

The first lower member 600 may be disposed below the cushion member 500. The cushion member 500 may be bonded to an upper surface of a plate 610 included in the first lower member 600 through the second cushion adhesive layer 540. The first lower member 600 may support components disposed on an upper portion thereof. The first lower member 600 may be referred to as a lower support member.

The lower member 600 may include a plate 610, a lower adhesive layer 620, and a cover layer 630. Components included in each of the lower member 600 are not limited to the components described above. At least some of the components described above may be omitted, and other components may be added. The plate 610 may include a material having a modulus of about 60 GPa or greater at a room temperature. The plate 610 may include a metal. The plate 610 may include a single metal material or an alloy of a plurality of metal materials. In one embodiment, for example, the plate 610 may include a stainless steel, e.g., SUS304, but is not limited thereto. The plate 610 may support components disposed on the upper portion. In an embodiment, the electronic device 1000 may have improved heat dissipation performance through the plate 610.

An opening 611 may be defined in a portion of the plate 610. The opening 611 may be defined in an area overlapping the second area 1000A2. On a plane, for example, when viewed in the third direction DR3, the opening 611 may overlap the second area 1000A2. A portion of the plate 610 may be more easily deformed through the opening 611.

The cover layer 630 may be bonded to the plate 610 through the lower adhesive layer 620. The lower adhesive layer 620 may include a conventional adhesive or a gluing agent. Unlike shown in FIG. 3A, the lower adhesive layer 620 may not be disposed in area portion of the plate 610, which overlaps the second area 1000A2. The cover layer 630 may cover the opening 611 of the plate 610. Accordingly, introduction of foreign substances into the opening 611 may be further prevented.

The cover layer 630 may include a material having a lower elastic modulus than the plate 610. The cover layer 630 may include a material having an elastic modulus of about 30 MPa or less and a break elongation of 100% or greater. In one embodiment, for example, the cover layer 630 may include at least one selected from an acrylic-based resin, a methacrylate-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin. In one embodiment, for example, the cover layer 630 may include thermoplastic polyurethane, but is not limited thereto. The cover layer 630 may be a thermoplastic polyurethane film having a mesh pattern formed thereon.

The plate 610 may have a thickness in a range of about 120 μm to about 180 μm, and may have a thickness of, for example, about 150 μm. The lower adhesive layer 620 may have a thickness in a range of about 4 μm to about 15 μm, and may have a thickness of, for example, about 8 μm. The cover layer 630 may have a thickness in a range of about 4 μm to about 15 μm, and may have a thickness of, for example, about 8 μm. However, the thicknesses of the plate 610, the lower adhesive layer 620, and the cover layer 630 are not limited to the values described above.

Second lower members 700 may be disposed below the first lower member 600. The second lower members 700 may be disposed to be spaced apart from each other. In one embodiment, for example, one second lower member 700 may be disposed in the first area 1000A1, and another second lower member 700 may be disposed in the third area 1000A3.

The second lower members 700 may each be bonded to the lower member 600 through fourth adhesive layers 1040. In one embodiment, for example, one fourth adhesive layer 1040 may be bonded to a lower surface of the first lower member 600 overlapping the first area 1000A1, and another fourth adhesive layer 1040 may be bonded to a lower surface of the lower member 600 overlapping the third area 1000A3. The fourth adhesive layers 1040 may not overlap the second area 1000A2. The fourth adhesive layers 1040 may each have a thickness in a range of about 8 μm to about 15 μm, and for example, may have a thickness of about 8 μm, but the thicknesses of the fourth adhesive layer 1040 are not limited thereto.

In an embodiment, a step compensation film (not shown) may be further disposed between each of the second lower members 700 and the first lower member 600. In one embodiment, for example, the step compensation film may be provided in an area overlapping the second area 1000A2. The adhesion of one surface of the step compensation film may be lower than that of the other surface. In one embodiment, for example, the one surface may not have adhesive force. The one surface may be a surface facing the first lower member 600.

The second lower members 700 may each include a lower plate 710, a heat dissipation sheet 720, and an insulating film 730. Components included in each of the second lower member 700 are not limited to the components described above. At least some of the components described above may be omitted, and other components may be added.

The lower plate 710 is provided in plurality. One of the lower plates 710 may be disposed to overlap a portion of the first area 1000A1 and the second area 1000A2, and another of the lower plates 710 may be disposed to overlap another portion of the second area 1000A2 and the third area 1000A3.

The lower plates 710 may be disposed to be spaced apart from each other in the second area 1000A2. However, the lower plates 710 may be disposed substantially close to, e.g., as close as possible to support, an area in which the opening 611 of the plate 610 is formed. In one embodiment, for example, the lower plates 710 may prevent the area in which the opening 611 of the plate 610 is defined from being deformed due to pressure applied from the top.

In an embodiment, the lower plates 710 may serve to prevent the components disposed on the second lower members 700 from being deformed due to the components disposed below the second lower members 700.

The lower plates 710 may each include a metal alloy, and for example, the lower plates 710 may each include a copper alloy. However, the materials forming the lower plates 710 are not limited thereto. The lower plates 710 may each have a thickness in a range of about 60 µm to about 100 µm, and for example, may have a thickness of about 80 µm, but the thickness of the lower plates 710 is not limited thereto.

The heat dissipation sheet 720 may be bonded below the lower plate 710. The heat dissipation sheet 720 may be a heat conduction sheet having high thermal conductivity. In one embodiment, for example, the heat dissipation sheet 720 may include a heat dissipation layer 721, a first heat dissipation adhesive layer 722, a second heat dissipation adhesive layer 723, and a gap tape 724.

The gap tape 724 may be bonded to the first heat dissipation adhesive layer 722 and the second heat dissipation adhesive layer 723, which are spaced apart from each other with the heat dissipation layer 721 therebetween. The gap tape 724 may have a plurality of layers. In one embodiment, for example, the gap tape 724 may include a base layer, an upper adhesive layer disposed on an upper surface of the base layer, and a lower adhesive layer disposed on a lower surface of the base layer.

The heat dissipation layer 721 may be bonded to the lower plate 710 through the first heat dissipation adhesive layer 722. The heat dissipation layer 721 may be sealed through the first heat dissipation adhesive layer 722, the second heat dissipation adhesive layer 723, and the gap tape 724. The heat dissipation layer 721 may be a graphitized polymer film. The polymer film may be, for example, a PI film. The first heat dissipation adhesive layer 722 and the second heat dissipation adhesive layer 723 may each have a thickness in a range of about 3 µm to about 8 µm, and may have a thickness of, for example, about 5 µm. The heat dissipation layer 721 and the gap tape 724 may each have a thickness in a range of about 10 µm to about 25 µm, and may have a thickness of, for example, about 17 µm. However, the thickness of each of the first heat dissipation adhesive layer 722, the second heat dissipation adhesive layer 723, the heat dissipation layer 721, and the gap tape 724 is not limited to the values described above.

The insulating film 730 may be bonded below the heat dissipation sheet 720. In one embodiment, for example, the insulating film 730 may be bonded to the second heat dissipation adhesive layer 723. Rattle may be prevented from being caused in the electronic device 1000 through the insulating film 730. The thickness of the insulating film 730 may be 15 µm, but is not limited thereto.

The step compensation member 800 may be disposed below the plate 610. In one embodiment, for example, the second lower adhesive member 700 may be disposed below a portion of the plate 610, and the step compensation member 800 may be disposed below another portion of the plate 610.

The step compensation member 800 may include a first compensation adhesive layer 810, a step compensation film 820, and a second compensation adhesive layer 830. The first compensation adhesive layer 810 may be bonded to the lower surface of the plate 610. The step compensation film 820 may be a synthetic resin film. The second compensation adhesive layer 830 may be bonded to a lower surface of the step compensation film 820 and a set (not shown).

In an embodiment, a lower cushion film (not shown) including a lower cushion layer may be further disposed below the second lower member 700 or the step compensation member 800.

Embodiments of an electronic device according to the invention include a cushion member disposed below the display panel to absorb external shocks applied to the electronic device, and the cushion member includes a barrier film having a high modulus and a cushion layer disposed on a lower surface of the barrier film. In such embodiments, the barrier film includes a PI film having a high modulus in a range of about 1 GPa to about 15 GPa, and the cushion layer includes a foam having a low modulus of about 1 MPa or less. Accordingly, embodiments of the electronic device may have improved impact resistance and a visibility issue thereof may be prevented.

Conventional electronic devices typically include a cushion member having compressibility between a lower protective film and a lower support member to absorb external shocks, but the cushion member including a thermoplastic polyurethane ("TPU") film has a surface quality measurement value of about 1 Kc to about 1.3 Kc, which indicates poor surface quality, and accordingly, a visibility issue that the cushion member is viewed from the outside may be caused. In embodiments of the electronic device according to the invention, a cushion member including a foam is disposed between the lower protective film and the lower support member. In such embodiments, the electronic device includes a foam having high surface quality with a surface quality measurement value of about 0.45 Kc, and an issue that the cushion member is viewed from the outside may thus be prevented. If the cushion member includes only a foam, the impact resistance against external shocks may be reduced. However, in embodiments of the electronic device according the invention, a film having a high modulus such as a PI film is disposed on the foam to improve the impact resistance against external shocks of the electronic device.

Referring to FIG. 3B, in an alternative embodiment, a cushion member 500-1 included in an electronic device 1000-1 may further include an intermediate cushion adhesive layer 550 disposed between the barrier film 520 and the cushion layer 530. In the cushion member 500-1, the barrier film 520 and the cushion layer 530 may be bonded through the intermediate cushion adhesive layer 550. The cushion layer 530 may be directly bonded to the barrier film 520 through the intermediate cushion adhesive layer 550. Herein, "directly bonded" may indicate that one component and another component are bonded through an adhesive layer with only the adhesive layer therebetween. In one embodiment, for example, "directly bonded" may indicate that two layers or two members are bonded to each other through an adhesive layer disposed between the two layers or the two members. The cushion layer 530 may contact a lower surface of the intermediate cushion adhesive layer 550, and the barrier film 520 may contact an upper surface of the intermediate cushion adhesive layer 550.

The cushion layer 530 may be formed by applying a mixture including a polymer resin and a foaming agent onto another substrate, for example, a carrier substrate, and then foaming the foaming agent. After the forming of the cushion layer 530 on the carrier substrate, the cushion layer 530 may be bonded to the lower surface of the barrier film 520 through the intermediate cushion adhesive layer 550. Thereafter, the carrier substrate may be removed.

Hereinafter, with reference to Examples and Comparative Examples, an embodiment of an electronic device will be specifically described. Examples shown below are illustrated only for the understanding of the invention, and the scope of the invention is not limited thereto.

Figure 5A:
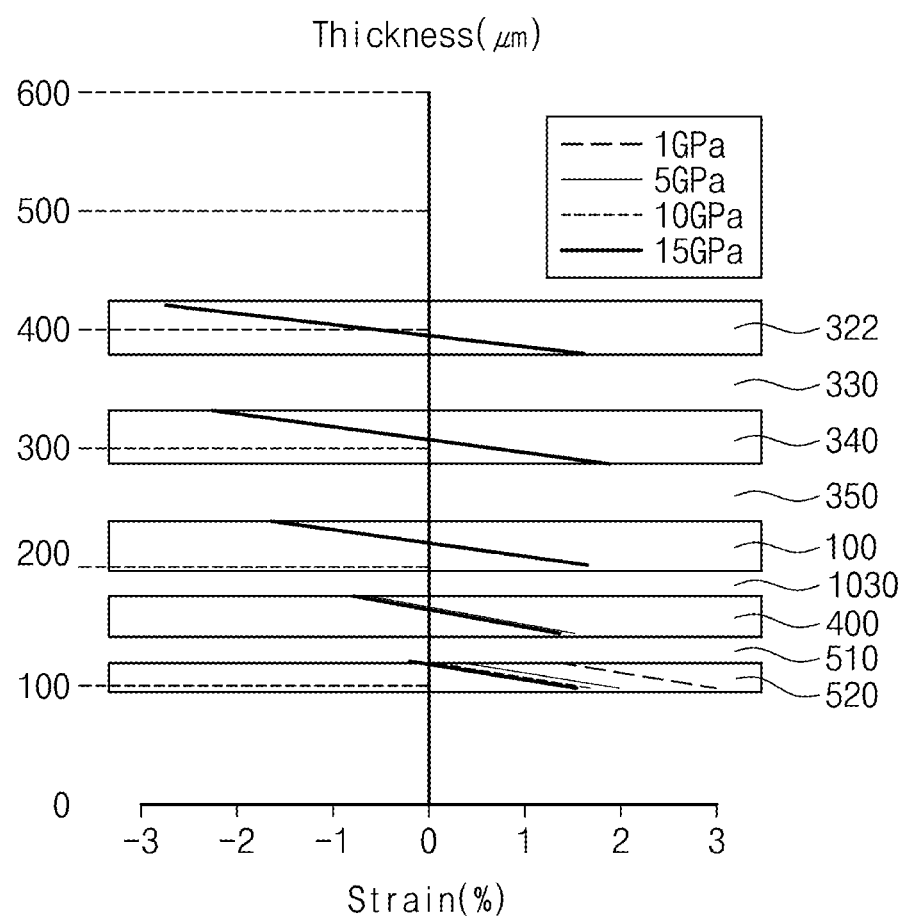
FIG. 5A is a graph showing a strain according to a thickness of an electronic device according to an embodiment of the invention.
Figure 5B:
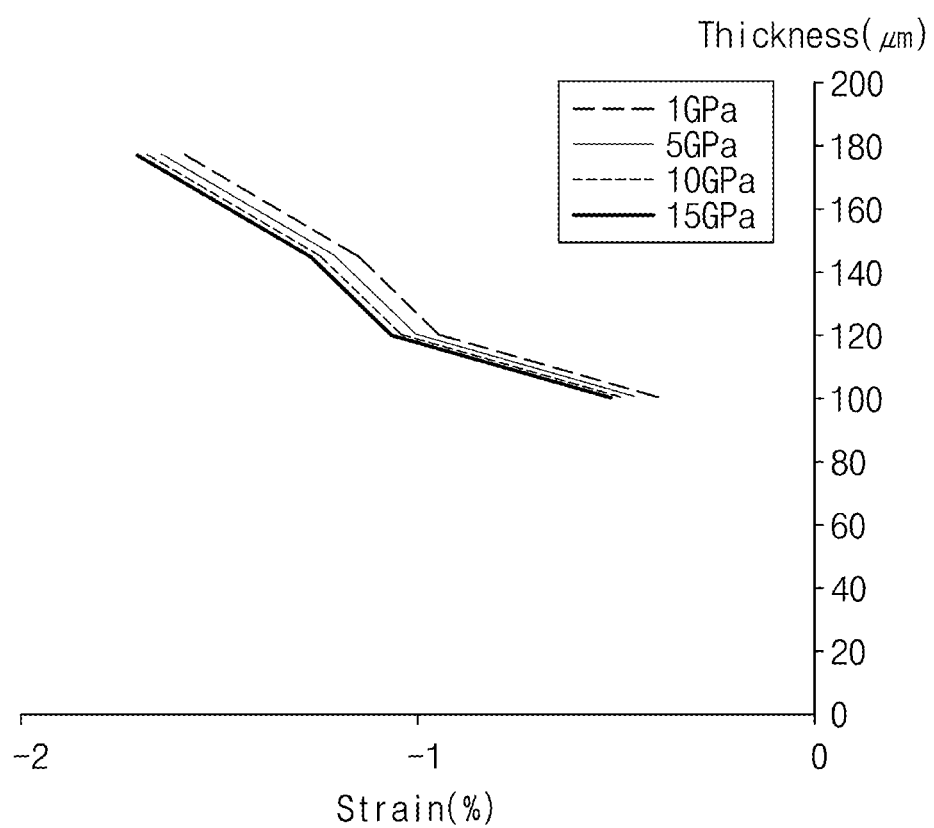
FIG. 5B is a graph showing a strain according to a thickness of a display panel according to an embodiment of the invention.

FIG. 5A is a graph showing a strain of each layer included in an electronic device along a thickness direction of the electronic device according to an embodiment of the invention. FIG. 5B is a graph showing a strain for each portion of a display panel along a thickness direction of the display panel according to an embodiment of the invention. In FIGS.

5A and 5B, a negative strain indicates a compressive strain of a target component, and a positive strain indicates a tensile strain of a target component. FIG. 5B illustrates a graph of only a portion having a compressive strain in a display panel included in an electronic device.

FIG. 5A is a graph measuring a strain of each layer disposed along a thickness direction of an electronic device with changes in modulus of the barrier film 520. FIG. 5A is directed to an embodiment of an electronic device having a structure in which a barrier film 520, a first cushion adhesive layer 510, a lower protective film 400, a third adhesive layer 1030, a display panel 100, a second upper adhesive layer 350, a window 340, a first upper adhesive layer 330, and a second protective layer 322 are sequentially stacked.

Referring to FIG. 5A, it is shown that with a decrease in the modulus of the barrier film 520, the lower surface of the barrier film 520 has a higher tensile strain. More particularly, it is shown that when the barrier film 520 has a modulus of about 15 GPa, the lower surface of the barrier film 520 has a tensile strain of about 1.46%, when the barrier film 520 has a modulus of about 10 GPa, the lower surface of the barrier film 520 has a tensile strain of about 1.63%, when the barrier film 520 has a modulus of about 5 GPa, the lower surface of the barrier film 520 has a tensile strain of about 1.98%, and when the barrier film 520 has a modulus of about 1 GPa, the lower surface of the barrier film 520 has a tensile strain of about 2.95%. According to the results of FIG. 5A, it is shown that when the barrier film 520 has a modulus of less than about 1 GPa, the lower surface of the barrier film 520 has a high tensile strain of 3% or greater, and accordingly, cracks due to folding may be caused.

FIG. 5B is a graph specifically showing a strain of the display panel 100 shown in FIG. 5A.

Referring to FIG. 5B, it is shown that with an increase in the modulus of the barrier film 520, the upper surface of the display panel 100 has a higher compressive strain. More particularly, it is shown that when the barrier film 520 has a modulus of about 1 GPa, the upper surface of the display panel 100 has a compressive strain of about −1.59%, when the barrier film 520 has a modulus of about 5 GPa, the upper surface of the display panel 100 has a compressive strain of about −1.65%, when the barrier film 520 has a modulus of about 10 GPa, the upper surface of the display panel 100 has a compressive strain of about −1.69%, and when the barrier film 520 has a modulus of about 15 GPa, the upper surface of the display panel 100 has a compressive strain of about −1.71%. According to the results of FIG. 5B, it is shown that when the barrier film 520 has a modulus of greater than about 15 GPa, the upper surface of the display panel 100 has a high compressive strain to increase chances of having defects such as buckling between layers disposed on the upper portion of the display panel 100.

Table 1 below shows evaluation data of impact resistance and surface quality properties of electronic devices according to Examples corresponding to embodiments of the invention and Comparative Examples. In Examples 1 to 4 of Table 1, the impact resistance and surface quality properties of electronic devices including a barrier film satisfying modulus ranges of an embodiment of the invention, and a cushion layer disposed on a lower surface of the barrier film and having a foam were evaluated. In Comparative Example 1 of Table 1, the barrier film of the invention was omitted, and the impact resistance and surface quality properties of an electronic device including only a foam cushion layer were evaluated. In Comparative Example 2 of Table 1, the barrier film of the invention was omitted, and the impact resistance and surface quality properties of an electronic device including only a cushion layer of a TPU film were evaluated. The impact resistance was evaluated by measuring minimum heights at which bright spots are caused through a pen drop test. The surface quality properties were evaluated whether the unevenness of a cushion member was viewed from the top of the electronic device with naked eyes, and when the unevenness was not viewed, it was evaluated as good, and when the unevenness was viewed, it was evaluated as defective.

TABLE 1

| Type | Barrier film modulus (GPa) | Barrier film thickness (μm) | Impact resistance (cm) | With/without bending/visibility (Surface quality properties) |
| --- | --- | --- | --- | --- |
| Example 1 | 7.8 | 20 | 6 | Good |
| Example 2 | 1.4 | 40 | 6 | Good |
| Example 3 | 11.4 | 12 | 7 | Good |
| Example 4 | 2.5 | 8 | 5 | Good |
| Comparative Example 1 | — | — | 4 | Good |
| Comparative Example 2 | — | — | 6 | Defective |

Referring to the results of Table 1, it is shown that the electronic device including a cushion member having a barrier film and a cushion layer according to an embodiment of the invention had a fair height of bright spots in a range of about 5 centimeters (cm) to about 7 cm, and had no issue of being viewed from the outside. As in Comparative Example 1, when the electronic device only including the cushion layer formed through the foam without including the barrier film, the issue of being viewed from the outside was prevented, but the impact resistance deteriorated. As in Comparative Example 2, it is confirmed that when the electronic device including a cushion layer as a thermoplastic polyurethane film having a modulus in the range of about 30 MPa to about 60 MPa without including a barrier film, the impact resistance was similar to that of the electronic device according to an embodiment of the invention, but due to low surface quality of the thermoplastic polyurethane film, an issue of an uneven surface of the cushion layer being viewed from the outside was caused. Accordingly, it is shown that the electronic device including the cushion member having the barrier film and the cushion layer as in an embodiment of the invention may have improved impact resistance and prevent an issue of visibility. Table 2 below shows evaluation data of folding properties of electronic devices according to Examples corresponding to embodiments of the invention and Comparative Examples. In Examples 5 and 6 of Table 2, the folding properties of electronic devices including a barrier film satisfying break elongation ranges according to an embodiment of the invention, and a cushion layer disposed on a lower surface of the barrier film and having a foam were evaluated. In Comparative Examples 3 and 4 of Table 2, the folding properties of electronic devices including a barrier film and a cushion layer disposed on a lower surface of the barrier film and having a foam but having different break elongation ranges of the barrier film from the electronic devices of Examples were evaluated. For the folding properties, when the electronic devices were repeatedly folded 30,000 times at each of a room temperature, a low temperature, a high temperature and humidity, the presence of defects such as cracks in the electronic device was checked, and no presence of defects was evaluated as good.

TABLE 2

| Type | Barrier film break elongation (%) | Folding properties |
| --- | --- | --- |
| Example 5 | 35 | Good |
| Example 6 | 188.4 | Good |
| Comparative Example 3 | 8.1 | Defective |
| Comparative Example 4 | 4.7 | Defective |

Referring to the results of Table 2, it is shown that the electronic device including a barrier film and a cushion member having a cushion layer according to an embodiment had high folding properties at each of a room temperature, a low temperature, and a high temperature and high humidity. The electronic devices of Comparative Examples 3 and 4 included a barrier film and a cushion layer disposed on the lower surface of the barrier film and having a foam, but unlike the embodiments of the invention, the electronic devices had a break elongation of less than about 20%, indicating that the folding properties deteriorated and defects such as cracks were caused after repeated folding action. Accordingly, it is shown that the electronic device including the barrier film and the cushion member having the cushion layer according to an embodiment may have improved folding properties.

According to an embodiment of the invention, an electronic device may have improved impact resistance, and may prevent components such as a cushion member, etc. from being viewed from the outside.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. An electronic device comprising:
   a window;
   a display panel disposed below the window;
   a cushion member disposed below the display panel, wherein the cushion member includes:
     a barrier film having a modulus in a range of about 1.4 GPa to about 12 GPa, wherein the barrier film has a thickness in a range of about 8 μm to about 40 μm; and
     a cushion layer disposed below the barrier film and having a modulus of about 1 MPa or less;
   a lower protective member disposed between the display panel and the barrier film of the cushion member, and the lower protective member comprises a polymer film; and
   a plate including at least one opening and having a modulus of about 60 GPa or greater, wherein the plate is directly bonded to a lower surface of the cushion layer, and
   wherein the cushion layer is directly disposed on a lower surface of the barrier film, or
   the cushion member further comprises an intermediate cushion adhesive layer, wherein the cushion layer is directly bonded to a lower surface of the barrier film through the intermediate cushion adhesive layer.

2. The electronic device of claim 1, wherein the barrier film comprises at least one selected from polyimide, polyamide, polyetheretherketone, and polyethylene terephthalate.

3. The electronic device of claim 1, wherein the cushion layer comprises a foam.

4. The electronic device of claim 1, wherein the cushion layer has an average density in a range of about 0.1 g/cm$^3$ to about 0.9 g/cm$^3$.

5. The electronic device of claim 1, wherein at least one folding area is defined in the display panel.

6. The electronic device of claim 5, wherein a first non-folding area, a first folding area, a second non-folding area, a second folding area, and a third non-folding area are defined in the display panel along one direction.

7. The electronic device of claim 1, wherein:
   the cushion layer has a thickness in a range of about 60 μm to about 120 μm.

8. The electronic device of claim 1, wherein the barrier film has a break elongation in a range of about 20% to about 200%.

9. The electronic device of claim 1, further comprising:
   a lower support member disposed below the cushion member.

10. The electronic device of claim 1, further comprising:
    an anti-reflection member disposed between the display panel and the window.

11. The electronic device of claim 1, wherein the display panel comprises:
    a base layer;
    a circuit layer disposed on the base layer;
    a light emitting element layer disposed on the circuit layer;
    an encapsulation layer disposed on the light emitting element layer; and
    a sensor layer disposed on the encapsulation layer.

12. An electronic device comprising: a window; a display panel disposed below the window; a cushion member disposed below the display panel, wherein the cushion member includes:
    a barrier film having a modulus in a range of about 1.4 GPa to about 12 GPa and having a break elongation in a range of about 20% to about 200%,
    wherein the barrier film has a thickness in a range of about 8 m to about 40 m; and
    a cushion layer disposed below the barrier film; and
    a plate including at least one opening and having a modulus of about 60 GPa or greater, wherein the plate is directly bonded to a lower surface of the cushion layer; and a lower protective member disposed between the display panel and the barrier film of the cushion member, and the lower protective member comprises a polymer film, wherein the cushion layer is directly disposed on a lower surface of the barrier film, or the cushion member further comprises an intermediate cushion adhesive layer, wherein the cushion layer is directly bonded to a lower surface of the barrier film through the intermediate cushion adhesive layer.

13. The electronic device of claim 12, wherein:

the barrier film comprises polyimide; and the cushion layer comprises a foam having a modulus of about 1 MPa or less.

14. The electronic device of claim 12, wherein:

the cushion layer has a thickness in a range of about 60 µm to about 120 µm.

15. The electronic device of claim 12, wherein the display panel is folded and unfolded along a folding axis extending along one direction.

16. An electronic device comprising:

a window;

an anti-reflection member disposed below the window;

a display panel disposed below the anti-reflection member;

a lower protective member disposed below the display panel;

a cushion member disposed below the lower protective member, wherein the cushion member includes:

a barrier film having a modulus in a range of about 1.4 GPa to about 12 GPa, wherein the barrier film has a thickness in a range of about 8 µm to about 40 µm; and a cushion layer disposed below the barrier film and having a foam; and a plate including at least one opening and having a modulus of about 60 GPa or greater, wherein the plate is directly bonded to a lower surface of the cushion layer, and wherein the lower protective member is disposed between the display panel and the barrier film of the cushion member, and the lower protective member comprises a polymer film, and wherein the window, the anti-reflection member, the display panel, the lower protective member, and the cushion member are folded and unfolded along a folding axis extending along one direction, and wherein the cushion layer is directly disposed on a lower surface of the barrier film, or the cushion member further comprises an intermediate cushion adhesive layer, wherein the cushion layer is directly bonded to a lower surface of the barrier film through the intermediate cushion adhesive layer.

* * * * *